(12) United States Patent
Chang et al.

(10) Patent No.: US 8,723,609 B2
(45) Date of Patent: May 13, 2014

(54) VOLTAGE-CONTROLLED OSCILLATOR MODULE AND METHOD FOR GENERATING OSCILLATOR SIGNALS

(75) Inventors: Chih-Hsiang Chang, Taichung (TW); Nai-Chen Cheng, Changhua County (TW); Yu Lee, Hsinchu County (TW); Ching-Yuan Yang, Taichung (TW)

(73) Assignee: Idustrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/558,360

(22) Filed: Jul. 26, 2012

(65) Prior Publication Data

US 2013/0241661 A1    Sep. 19, 2013

(30) Foreign Application Priority Data

Mar. 13, 2012   (TW) .............................. 101108384 A

(51) Int. Cl.
*H03B 5/12* (2006.01)
*H03B 19/14* (2006.01)
*H03B 27/00* (2006.01)
*H03C 3/22* (2006.01)
*H03L 7/24* (2006.01)

(52) U.S. Cl.
CPC ............ *H03B 5/1212* (2013.01); *H03B 5/1228* (2013.01); *H03B 5/124* (2013.01); *H03B 19/14* (2013.01); *H03B 27/00* (2013.01); *H03B 2200/004* (2013.01); *H03B 2200/0078* (2013.01); *H03B 2201/0208* (2013.01); *H03L 7/24* (2013.01)
USPC .................... 331/51; 331/45; 331/48; 331/52; 331/117 FE; 331/177 V; 327/118

(58) Field of Classification Search
CPC ...... H03B 5/12; H03B 5/1206; H03B 5/1212; H03B 5/1228; H03B 5/124; H03B 5/1243; H03B 19/00; H03B 19/06; H03B 19/14; H03B 25/00; H03B 2200/004; H03B 2200/0078; H03B 2201/011; H03B 2201/0208; H03B 27/00; H03K 5/00006; H03L 7/24

USPC .......... 327/115, 117, 118; 331/45–48, 50–52, 331/117 FE, 117 R, 167, 177 V; 455/118, 455/323
See application file for complete search history.

(56) References Cited

U.S. PATENT DOCUMENTS 6,850,122 B2 * 2/2005 Ravi et al. ........................ 331/46
6,867,656 B2 * 3/2005 Hajimiri et al. .................. 331/45

(Continued)

FOREIGN PATENT DOCUMENTS

TW            201141046         11/2011

OTHER PUBLICATIONS

Richard et al., "A 17.5-to-20.94GHz and 35-to-41.88GHz PLL in 65nm CMOS for Wireless HD Applications", 2010 IEEE International Solid-State Circuits Conference, 2010, p. 252-p. 254.

(Continued)

*Primary Examiner* — Levi Gannon
(74) *Attorney, Agent, or Firm* — Jianq Chyun IP Office

(57) ABSTRACT

A voltage-controlled oscillator (VCO) module including a first VCO unit, a second VCO unit, and a matching circuit is provided. The first VCO unit includes a first terminal and a second terminal and generates a first oscillator signal. The second VCO unit is coupled to the first VCO unit and generates a second oscillator signal. The matching circuit is coupled between the first VCO unit and second VCO unit. The matching circuit includes a plurality of inductor modules respectively coupled between the first terminal of the first VCO unit and the second VCO unit, between the first terminal and the second terminal of the first VCO unit, and between the second terminal of the first VCO unit and the second VCO unit. Furthermore, a method for generating oscillator signals is also provided.

23 Claims, 4 Drawing Sheets

(56) References Cited

U.S. PATENT DOCUMENTS

| | | | |
|---|---|---|---|
| 7,336,135 B2 * | 2/2008 | Higashi et al. | 331/108 B |
| 7,847,650 B2 * | 12/2010 | Yao et al. | 331/167 |
| 7,961,056 B2 | 6/2011 | Taylor et al. | |
| 8,031,019 B2 | 10/2011 | Chawla et al. | |
| 8,436,689 B2 * | 5/2013 | Lee | 331/117 FE |
| 2009/0289727 A1 * | 11/2009 | El Rai | 331/46 |
| 2010/0194485 A1 | 8/2010 | Chawla et al. | |
| 2011/0032044 A1 | 2/2011 | Lee et al. | |
| 2011/0057732 A1 | 3/2011 | Taylor et al. | |
| 2011/0156829 A1 | 6/2011 | Wang | |

OTHER PUBLICATIONS

Pellerano et al., "A 39.1-to-41.6 GHz ΔΣ fractional-N frequency synthesizer in 90nm CMOS", 2008 IEEE International Solid-State Circuits Conference, 2008, p. 484-p. 485, p. 630.

Cao et al., "A 50-GHz Phase-Locked Loop in 0.13-um CMOS", IEEE Journal of Solid-State Circuits, Aug. 2007, vol. 42, No. 8, p. 1649-p. 1656.

Cho et al., "A 1.2-V 37-38.5-GHz Eight-Phase Clock Generator in 0.13-um CMOS Technology", IEEE Journal of Solid-State Circuits, Jun. 2007, vol. 42, No. 6, p. 1261-p. 1270.

Lee et al., "A 28.5-32-GHz Fast Settling Multichannel PLL Synthesizer for 60-GHz WPAN Radio", IEEE Transactions on Microwave Theory and Techniques, May 2008, vol. 56, No. 5, p. 1234-p. 1246.

Ng et al., "A 1-V 24-GHz 17.5-mW Phase-Locked Loop in a 0.18-um CMOS Process", IEEE Journal of Solid State Circuits, Jun. 2006, vol. 41, No. 6, p. 1236-p. 1244.

Lee et al., "A 58-to-60.4GHz Frequency Synthesizer in 90nm CMOS", ISSCC 2007, 2007, p. 196-p. 197, p. 596.

Park et al., "A Low-Noise and Low-Power Frequency Synthesizer Using Offset Phase-Locked Loop in 0.13-um CMOS", IEEE Microwave and Wireless Components Letters, Jan. 2010, vol. 20, No. 1, p. 52-p. 54.

* cited by examiner

VOLTAGE-CONTROLLED OSCILLATOR MODULE AND METHOD FOR GENERATING OSCILLATOR SIGNALS

CROSS-REFERENCE TO RELATED APPLICATION

This application claims the priority benefit of Taiwan application serial no. 101108384, filed on Mar. 13, 2012. The entirety of the above-mentioned patent application is hereby incorporated by reference herein and made a part of this specification.

BACKGROUND OF THE DISCLOSURE

1. Field of the Disclosure

The disclosure relates to a voltage-controlled oscillator (VCO) and a method for generating oscillator signals thereof, and more particularly to a VCO with current reuse scheme and a method for generating oscillator signals thereof.

2. Description of Related Art

In recent years, due to the development of the wireless communication, the manufacturing technology of integrated circuit (IC) has a violent variation within a short time, especially for the circuits of the transmitter and receiver applied in radio frequency (RF). With rapid progress in semiconductor manufacturing technology, the current application of IC at Giga Hertz (GHz) becomes wider and wider, and even progresses to higher operation frequency. Accordingly, the design of the circuits of the transmitter and receiver is more difficult and has more power consumption and challenges. Therefore, how to design a high-frequency RF circuit with more power saving and provide a stable, low-power and adjustable reference frequency for the RF circuit is an important issue presently.

Generally, it is very difficult to design a frequency oscillator with high-frequency and low-power simultaneously. The 60 GHz optical wireless signal circuits developed by factories can not be used in portable mobile devices because the power consumption of the whole system is near to tens of watts. Battery can not serve as the power supply due to such power consumption, and heat sink is also an issue. If the power of high-frequency RF circuits can be reduced significantly, it will increase the feasibility of the circuits applied to portable mobile devices.

SUMMARY

The disclosure provides a voltage-controlled oscillator (VCO) module including a first VCO unit, a second VCO unit, and a matching circuit. The first VCO unit includes a first terminal and a second terminal and generates a first oscillator signal. The second VCO unit is coupled to the first VCO unit and generates a second oscillator signal. The matching circuit is coupled between the first VCO unit and the second VCO unit. The matching circuit includes a plurality of inductor modules respectively coupled between the first terminal of the first VCO unit and the second VCO unit, between the first terminal and the second terminal of the first VCO unit, and between the second terminal of the first VCO unit and the second VCO unit.

The disclosure provides a method for generating oscillator signals, and the method is adapted for a voltage-controlled oscillator (VCO) module. The VCO module includes a first VCO unit and a second VCO unit. Each of the VCO units includes a varactor unit. The method includes the following steps. A first inductor module is connected between a first terminal and a second terminal of the first VCO unit. A second inductor module is connected between the first terminal of the first VCO unit and the second VCO unit. A third inductor module is connected between the second terminal of the first VCO unit and the second VCO unit. At least one adjustable voltage is set to change capacitances of each of the varactor units, such that a first oscillator signal is generated from the first VCO unit and a second oscillator signal is generated from the second VCO unit. A frequency of the first oscillator signal and a frequency of the second oscillator signal are in response to the corresponding capacitances of the varactor units respectively.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
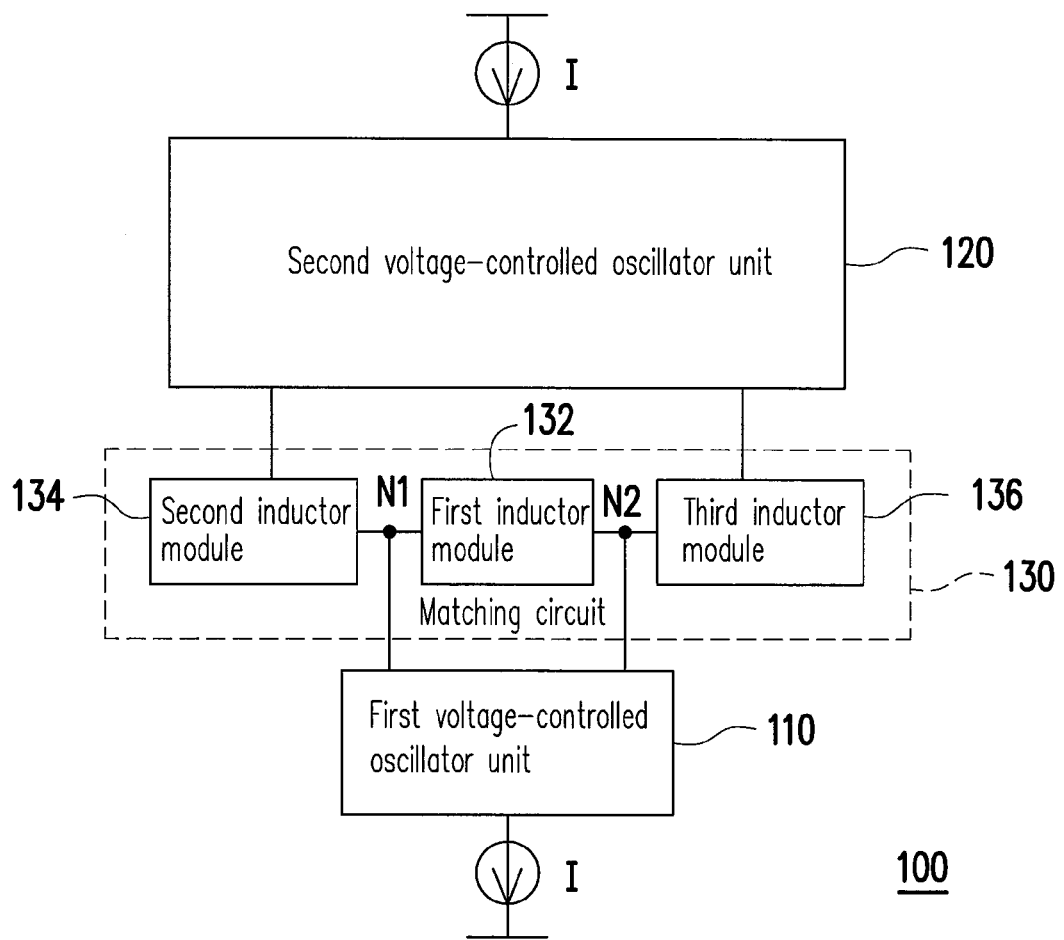
FIG. 1 is a schematic block diagram of a voltage-controlled oscillator (VCO) module according to an exemplary embodiment of the disclosure.

The disclosure discloses a voltage-controlled oscillator (VCO) with power consumption in a phase-lock loop and a high-frequency divider are cascaded and integrated by using a current reuse technique, and the VCO and the divider work normally and simultaneously by using a current path. Compared with the previous structure, if the current reuse technique is used in an output terminal of a high-frequency oscillator, the circuit of these two blocks can be reduced more than half of current consumption during operation. Besides, the divider generally used in the high-frequency circuit requires the method of injection locking to execute the function of division, but this method may cause concern of smaller locking range. Therefore, the method of changing the operation frequencies of the VCO and the divider synchronously is applied in the disclosure to solve the above-mentioned concern. Exemplary embodiments and drawings are provided below for detail descriptions. FIG. 1 is a schematic block diagram of a VCO module according to an exemplary embodiment of the disclosure. Referring to FIG. 1, the VCO module 100 of the present embodiment includes a first VCO unit 110, a second VCO unit 120 and a matching circuit 130. The first VCO unit 110 generates a first oscillator signal (not shown). The second VCO unit 120 is coupled to the first VCO unit 110 and generates a second oscillator signal (not shown). The matching circuit 130 is coupled between the first VCO unit 110 and second VCO unit 120 and includes a plurality of inductor modules 132, 134 and 136.

Specifically, the matching circuit 130 of the present embodiment includes a first inductor module 132, a second inductor module 134 and a third inductor module 136. The first inductor module 132 is coupled between a first terminal N1 and a second terminal N2 of the first VCO unit 110. The second inductor module 134 is coupled between the first terminal N1 of the first VCO unit 110 and the second VCO unit 120. The third inductor module 136 is coupled between the second terminal N2 of the first VCO unit 110 and the second VCO unit 120. In the present exemplary embodiment, each of the inductor modules is implemented by either an inductor pair with offset in parallel or an inductor, and the disclosure is not limited thereto.

In practical applications, the second VCO unit 120 of the present embodiment, for example, serves as a high-frequency current injection divider. The second VCO unit 120 and the first VCO unit 110 are cascaded and integrated to realize the current reuse by using a bias current I. In the current reuse structure, the first VCO unit 110 and the second VCO unit 120 not only work normally, but also reduce more than half of current consumption during operation.

Figure 2:
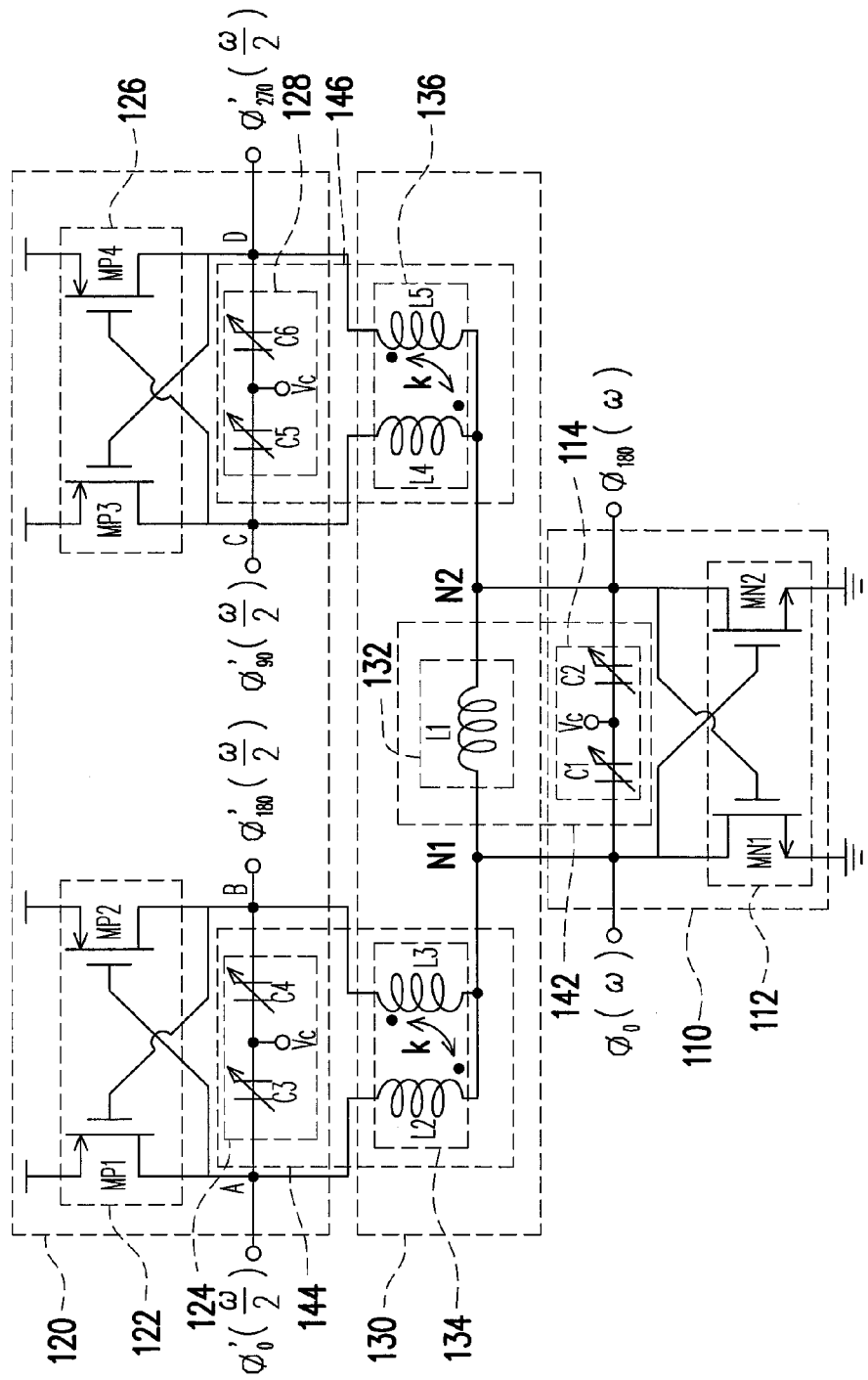
FIG. 2 is a schematic circuit diagram of the VCO module according to the exemplary embodiment of FIG. 1.

FIG. 2 is a schematic circuit diagram of the VCO module according to the exemplary embodiment of FIG. 1. Referring to FIG. 2, the first VCO unit 110 of the present embodiment provides a first oscillator signal. The first oscillator signal includes a pair of differential output signals $\phi_0(\omega)$ and $\phi_{180}(\omega)$ which are inverted to each other. In addition, the first VCO unit 110 includes a first transistor pair 112 and a first varactor unit 114, where the first transistor pair 112 includes a first transistor MN1 and a second transistor MN2. The first transistor MN1 and the second transistor MN2 are a pair of cross-coupling transistors. In the embodiment, the first transistor MN1 and the second transistor MN2 are implemented by NMOS transistors. In the cross-coupling structure, a gate of the first transistor MN1 is coupled to a drain of the second transistor MN2, a gate of the second transistor MN2 is coupled to a drain of the first transistor MN1, and sources of the first and second transistors MN1 and MN2 are coupled to a ground voltage respectively. The cross-coupled structure provides an equivalence negative resistance to offset a loss of an equivalence parasitic resistance of a first oscillator unit 142. In the embodiment, the equivalence negative resistance of the first transistor pair 112 is $-2/g_m$, where a transconductance $g_m$ is a small signal parameter of NMOS transistor. Accordingly, the first transistor pair 112 provides high impedance, such that the first oscillator unit 142 is liable to oscillate and the first oscillator signals $\phi_0(\omega)$ and $\phi_{180}(\omega)$ remain oscillating.

In the present exemplary embodiment, the first inductor module 132 is, for example, implemented by an inductor L1 and is coupled between a first terminal N1 and a second terminal N2 of the first VCO unit 110. The first oscillator unit 142 is formed with the first inductor module 132 and the first varactor unit 114. Specifically, the first varactor unit 114 of the present embodiment includes varactors C1 and C2 which are coupled in series. The first varactor unit 114 changes the capacitances of the varactors C1 and C2 in response to an adjustable voltage, so as to adjust a frequency $\omega$ of the first oscillator signals $\phi_{90}(\omega)$ and $\phi_{180}(\omega)$. In the present exemplary embodiment, an adjustable range of the frequency $\omega$ of the first oscillator signals $\phi_0(\omega)$ and $\phi_{180}(\omega)$ is increased effectively by using the first varactor unit 114. Herein, the adjustable voltage is, for example, set to a system voltage Vc.

On the other hand, referring to FIG. 2 continuously, the second VCO unit 120 of the present embodiment provides the second oscillator signal including a set of quadrature output signals $\phi'_0(\omega/2)$, $\phi'_{180}(\omega/2)$, $\phi'_{90}(\omega/2)$ and $\phi'_{270}(\omega/2)$. The set of quadrature output signals have the same frequency $\omega/2$, but the phase difference is 90 degrees.

In the present exemplary embodiment, the second VCO unit 120 includes a second transistor pair 122, a third transistor pair 126, a second varactor unit 124 and a third varactor unit 128. Similar to the structure of the first transistor pair 112, the second transistor pair 122 and the third transistor pair 126 of the present embodiment are a pair of cross-coupling transistors as well, and the disclosure is not limited thereto. The second transistor pair 122 includes a third transistor MP1 and a fourth transistor MP2. The third transistor pair 126 includes a fifth transistor MP3 and a sixth transistor MP4. For example, the third, fourth, fifth and sixth transistors MP1, MP2, MP3 and MP4 are implemented by PMOS transistors. In the second transistor pair 122, a gate of the third transistor MP1 is coupled to a drain of the fourth transistor MP2, a gate of the fourth transistor MP2 is coupled to a drain of the third transistor MP1, and sources of the third and fourth transistors MP1 and MP2 are coupled to the system voltage respectively. Similarly, in the third transistor pair 126, a gate of the fifth transistor MP3 is coupled to a drain of the sixth transistor MP4, a gate of the sixth transistor MP4 is coupled to a drain of the fifth transistor MP3, and sources of the fifth and sixth transistors MP3 and MP4 are coupled to the system voltage respectively. Herein, the second transistor pair 122 and the third transistor pair 126 not only offset the loss of equivalence parasitic resistances of the second and third oscillator units 144 and 146, but also provide high impedance, such that the second and third oscillator units 144 and 146 are liable to oscillate, and the second oscillator signals $\phi'_0(\omega/2)$, $\phi'_{180}(\omega/2)$, $\phi'_{90}(\omega/2)$ and $\phi'_{270}(\omega/2)$ remain oscillating.

In the present exemplary embodiment, the second inductor module 134 and the third inductor module 136 are, for example, implemented by inductors with offset in parallel respectively. The second inductor module 134, for example, includes inductors L2 and L3 which are coupled in parallel between the second varactor unit 124 and the first terminal N1 of the first VCO unit 110. A coefficient of mutual induction k is negative, and thus the inductors L2 and L3 belong to an offset inductor pair. Similarly, inductors L4 and L5 of the third inductor module 136 belong to an offset inductor pair as well. Inductors L4 and L5 are coupled in parallel between the third varactor unit 128 and the second terminal N2 of the first VCO unit 110.

Besides, the second inductor module 134 and the second varactor unit 124 form the second oscillator unit 144. Similar to the first varactor unit 114, the second varactor unit 124 of the present embodiment includes varactors C3 and C4 which are coupled in series between a first output terminal A and a second output terminal B of the second VCO unit 120. The capacitances of the varactors C3 and C4 are in response to an adjustable voltage, so as to adjust a frequency $\omega/2$ of the oscillator signals $\phi'_0(\omega/2)$ and $\phi'_{180}(\omega/2)$. Similarly, the third inductor module 136 and the third varactor unit 126 form the third oscillator unit 146. The third varactor unit 126 includes varactors C5 and C6 which are coupled in series between a third output terminal C and a fourth output terminal D of the second VCO unit 120. The capacitances of the varactors C5 and C6 are in response to an adjustable voltage, so as to adjust a frequency $\omega/2$ of the oscillator signals $\phi'_{90}(\omega/2)$ and $\phi'_{270}(\omega/2)$. In the present exemplary embodiment, the second VCO unit 120 serves as a current injection divider, and the frequency $\omega/2$ of the second oscillator signal is half of the frequency $\omega$ of the first oscillator signal. Therefore, the VCO module of the disclosure, for example, could be integrated into a phase-lock loop circuit, such that the first oscillator signal and the second oscillator signal with divide-by-two frequency are provided.

In the present exemplary embodiment, the adjustable voltages of the first, second and third varactor units 114, 124 and 128 are set to the system voltage Vc. This disclosure applies the method of changing the operation frequencies of the first VCO unit 110 and the second VCO unit 120 serving as the divider synchronously to solve the problem of smaller locking range caused by using the method of injection locking to execute the function of division.

In addition, in the present exemplary embodiment, the first inductor module 132 is, for example, implemented by an inductor L1, the second inductor module 134 and the third inductor module 136 are, for example, implemented by inductors coupled in parallel respectively, and the disclosure is not limited thereto.

In summary, the first oscillator signals $\phi_0(\omega)$ and $\phi_{180}(\omega)$ and the second oscillator signals $\phi'_0(\omega/2)$, $\phi'_{180}(\omega/2)$, $\phi'_{90}(\omega/2)$ and $\phi'_{270}(\omega/2)$ of the disclosure are generated by three oscillator units 142, 144 and 146 respectively. Three oscillator units 142, 144 and 146 generate negative impedances by three differential cross-coupling transistor pairs respectively, such that three oscillator units 142, 144 and 146 vibrate. Because of lock and traction of three oscillator units 142, 144 and 146 with each other, the oscillator frequency ω of the first oscillator signals $\phi_0(\omega)$ and $\phi_{180}(\omega)$ and the oscillator frequency ω/2 of the second oscillator signals $\phi'_0(\omega/2)$, $\phi'_{180}(\omega/2)$, $\phi'_{90}(\omega/2)$ and $\phi'_{270}(\omega/2)$ are generated. The second VCO unit 120 includes an injection locking frequency divider (ILFD) which include two differential cross-coupling transistor pairs, such that a four-phase output frequency ω/2 is generated.

In the existing technology, the VCO and the ILFD are supplied in different power supply currents, and these two blocks could operate individually with optimized power consumption. But the VCO and the ILFD still need individual power supply current. In order to reduce power consumption effectively, in the disclosure, the second VCO unit 120 serving as the divider is cascaded on the first VCO unit 110, as shown in FIG. 2. By such design, the power consumption is minimized and a power supply voltage path is used only. By the design of cascading the second VCO unit 120 on the first VCO unit 110, not only the power consumption but also the parasitic capacitance effect is reduced, such that a variable frequency range is increased. Probably, on principle of not changing the operating frequency, the design could enlarge the driving capability of inductors or transistors, such that the output signals are enhanced and the phase noise is improved indirectly.

Figure 3A:
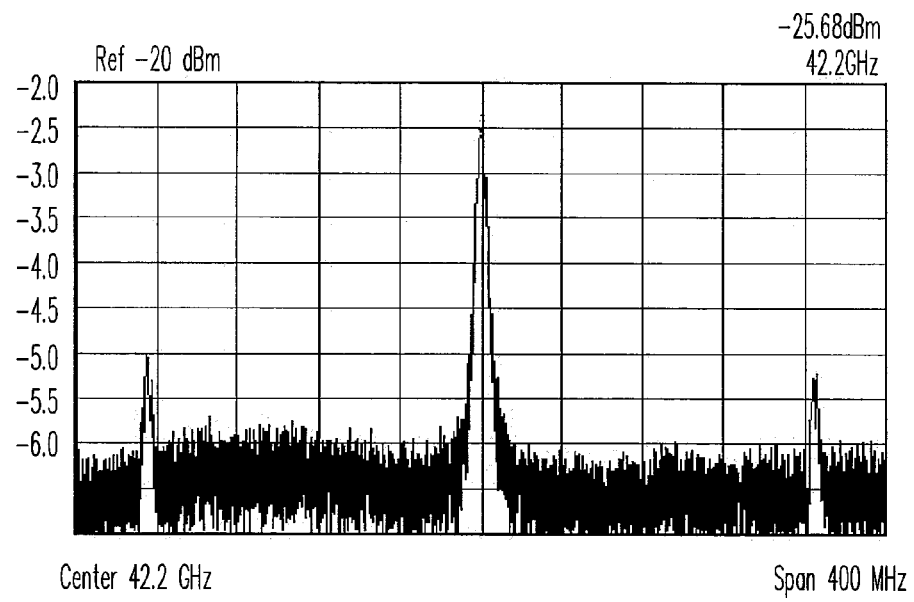
FIGS. 3A and 3B show the measurement results of the oscillator frequency verified by a single-chip circuit according to an exemplary embodiment of the disclosure.
Figure 3B:
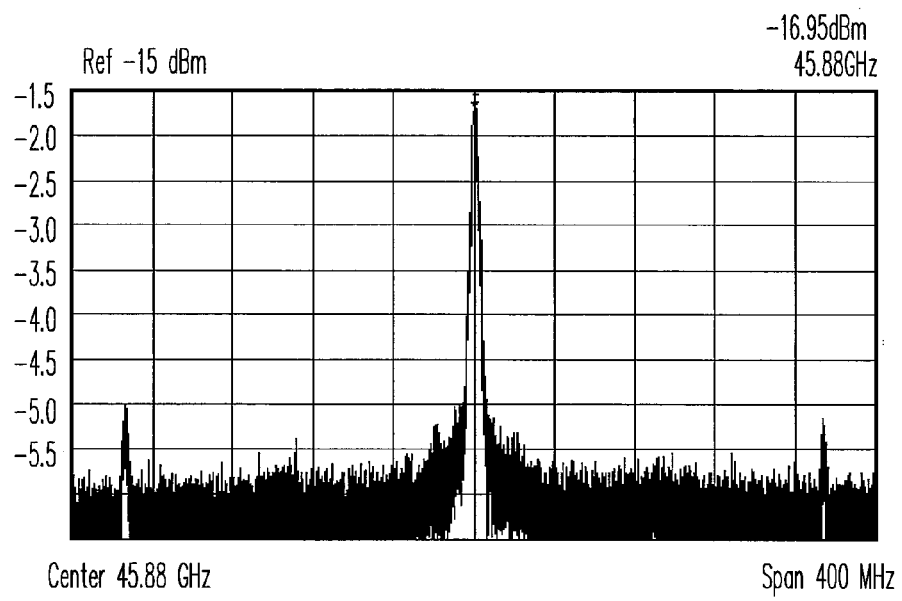

FIGS. 3A and 3B show the measurement results of the oscillator frequency verified by a single-chip circuit according to an exemplary embodiment of the disclosure. Referring to FIGS. 3A and 3B, if the single-chip circuit is implemented by 90 nm CMOS process, the results show that the output oscillator frequency is between 42.2 GHz and 45.3 GHz, and the power consumption of the circuit is only 24 mW, as shown in FIGS. 3A and 3B.

Figure 4:
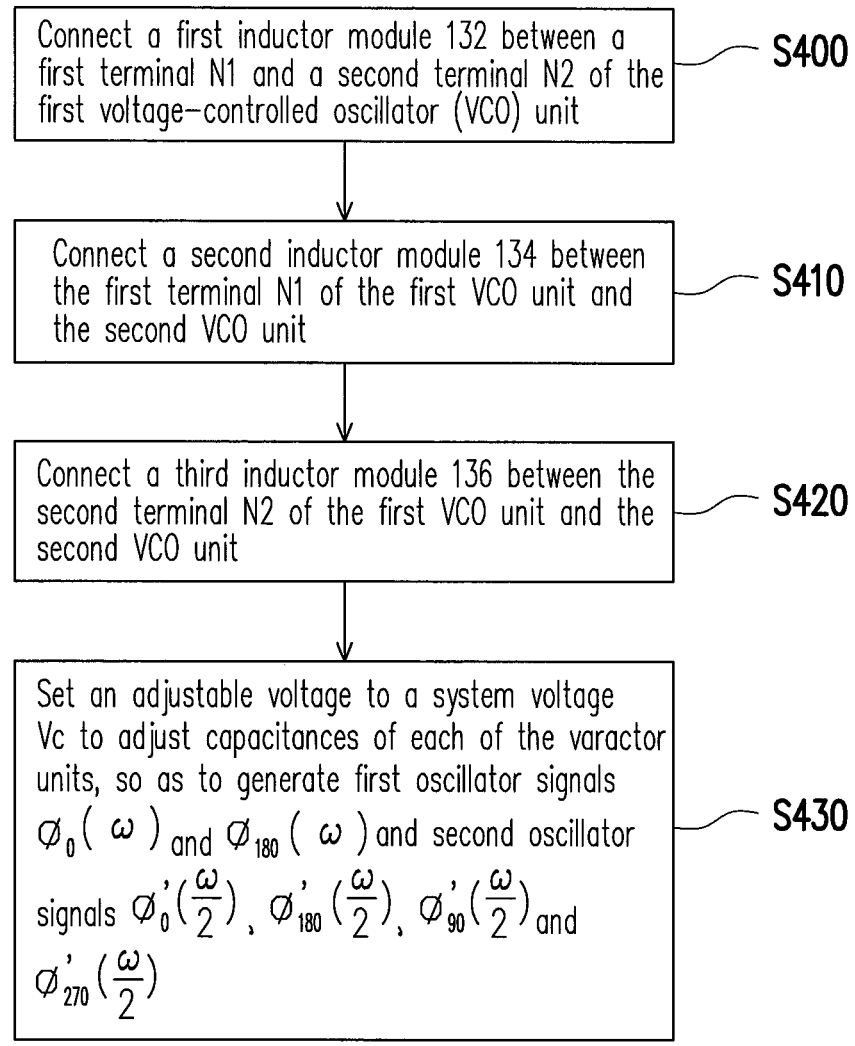
FIG. 4 is a flowchart illustrating the method for generating oscillator signals according to an exemplary embodiment of the disclosure.

FIG. 4 is a flowchart illustrating the method for generating oscillator signals according to an exemplary embodiment of the disclosure. Referring to FIG. 2 and FIG. 4, the method for generating oscillator signals of the present embodiment is, for example, adapted for the VCO modules of FIG. 1 or FIG. 2. The method includes the following steps. First, in step S400, the first inductor module 132 is connected between the first terminal N1 and the second terminal N2 of the first VCO unit 110. Next, in step S410, the second inductor module 134 is connected between the first terminal N1 of the first VCO unit 110 and the second VCO unit 120. Then, in step S420, the third inductor module 136 is connected between the second terminal N2 of the first VCO unit 110 and the second VCO unit 120. In step S430, an adjustable voltage is set to the system voltage Vc so as to change capacitances of each of the varactor units, such that the first oscillator signals $\phi_0(\omega)$ and $\phi_{180}(\omega)$ are generated from the first VCO unit 110 and the second oscillator signals $\phi'_0(\omega/2)$, $\phi'_{180}(\omega/2)$, $\phi'_{90}(\omega/2)$ and $\phi'_{270}(\omega/2)$ are generated from the second VCO unit 120. The frequency ω of the first oscillator signals and the frequency ω/2 of the second oscillator signals are in response to the corresponding capacitances of the varactor units respectively. In addition, in the present exemplary embodiment, the second VCO unit 120 serves as an injection locking frequency divider (ILFD), and the frequency ω/2 of the second oscillator signal is half of the frequency ω of the first oscillator signal. Besides, steps S400, S410 and S420 are implemented without order, that is, steps S400, S410 and S420 could be performed simultaneously, separately or in sequence.

Furthermore, enough teaching, suggestion, or implementation instructions of the method for generating oscillator signals according to an exemplary embodiment of the disclosure could be obtained from the descriptions of the embodiments of FIG. 1 to FIG. 4, and thus not repeated here.

In summary, the VCO units of the VCO module of the disclosure are cascaded and integrated, and a current path is used so as to realize the current reuse, such that the current consumption of the circuit is reduced during operation. In addition, the method of changing the operation frequency of each VCO unit synchronously is applied in the disclosure to increase variable frequency range.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A voltage-controlled oscillator (VCO) module, comprising:
   a first VCO unit, having a first terminal and a second terminal and generating a first oscillator signal;
   a second VCO unit, coupled to the first VCO unit and generating a second oscillator signal; and
   a matching circuit, coupled between the first VCO unit and the second VCO unit, wherein the matching circuit comprises a plurality of inductor modules respectively coupled between the first terminal of the first VCO unit and the second VCO unit, between the first terminal and the second terminal of the first VCO unit, and between the second terminal of the first VCO unit and the second VCO unit,
   wherein the second VCO unit serves as an injection locking frequency divider, and a frequency of the second oscillator signal is half of a frequency of the first oscillator signal.

2. The VCO module as claimed in claim 1, wherein the inductor modules comprises:
   a first inductor module, coupled between the first terminal and the second terminal of the first VCO unit, wherein the first inductor module comprises one of an inductor and a pair of inductors coupled in parallel;
   a second inductor module, coupled between the first terminal of the first VCO unit and the second VCO unit, wherein the second inductor module comprises one of an inductor and a pair of inductors coupled in parallel; and a third inductor module, coupled between the second terminal of the first VCO unit and the second VCO unit, wherein the third inductor module comprises one of an inductor and a pair of inductors coupled in parallel.

3. The VCO module as claimed in claim 2, wherein the first VCO unit comprises a first pair of cross-coupling transistors, the first pair of cross-coupling transistors comprises a first transistor and a second transistor, wherein a control terminal of the first transistor and a control terminal of the second transistor are coupled to a first terminal of the second transistor and a first terminal of the first transistor respectively, and a second terminal of the first transistor and a second terminal of the second transistor are coupled to a ground voltage respectively.

4. The VCO module as claimed in claim 2, wherein the first VCO unit comprises a first varactor unit coupled between the first terminal and the second terminal of the first VCO unit.

5. The VCO module as claimed in claim 4, wherein the first inductor module and the first varactor unit form a first oscillator unit, and the first varactor unit changes a capacitance of the first varactor unit in response to an adjustable voltage, so as to adjust a frequency of the first oscillator signal.

6. The VCO module as claimed in claim 2, wherein the second VCO unit comprises a second pair of cross-coupling transistors, the second pair of cross-coupling transistors comprises a third transistor and a fourth transistor, wherein a control terminal of the third transistor and a control terminal of the fourth transistor are coupled to a first terminal of the fourth transistor and a first terminal of the third transistor respectively, and a second terminal of the third transistor and a second terminal of the fourth transistor are coupled to a system voltage respectively.

7. The VCO module as claimed in claim 2, wherein the second VCO unit comprises a second varactor unit coupled between a first output terminal and a second output terminal of the second VCO unit.

8. The VCO module as claimed in claim 7, wherein the second inductor module and the second varactor unit form a second oscillator unit, and the second varactor unit changes a capacitance of the second varactor unit in response to an adjustable voltage, so as to adjust a frequency of the second oscillator signal.

9. The VCO module as claimed in claim 2, wherein the second VCO unit comprises a third pair of cross-coupling transistors, the third pair of cross-coupling transistors comprises a fifth transistor and a sixth transistor, wherein a control terminal of the fifth transistor and a control terminal of the sixth transistor are coupled to a first terminal of the sixth transistor and a first terminal of the fifth transistor respectively, and a second terminal of the fifth transistor and a second terminal of the sixth transistor are coupled to a system voltage respectively.

10. The VCO module as claimed in claim 2, wherein the second VCO unit comprises a third varactor unit coupled between a third output terminal and a fourth output terminal of the second VCO unit.

11. The VCO module as claimed in claim 10, wherein the third inductor module and the third varactor unit form a third oscillator unit, and the third varactor unit changes a capacitance of the third varactor unit in response to an adjustable voltage, so as to adjust a frequency of the second oscillator signal.

12. The VCO module as claimed in claim 1, wherein the first oscillator signal comprises a pair of differential output signals inverted to each other.

13. The VCO module as claimed in claim 1, wherein the second oscillator signal comprises a set of quadrature output signals.

14. A method for generating oscillator signals, adapted for a voltage-controlled oscillator (VCO) module, wherein the VCO module comprises a first VCO unit and a second VCO unit, and each of the VCO units comprises a varactor unit, the method comprising:

connecting a first inductor module between a first terminal and a second terminal of the first VCO unit;

connecting a second inductor module between the first terminal of the first VCO unit and the second VCO unit;

connecting a third inductor module between the second terminal of the first VCO unit and the second VCO unit; and setting at least one adjustable voltage to change capacitances of each of the varactor units, so as to generate a first oscillator signal from the first VCO unit and a second oscillator signal from the second VCO unit, wherein a frequency of the first oscillator signal and a frequency of the second oscillator signal are in response to the corresponding capacitances of the varactor units respectively; and wherein the second VCO unit serves as an injection locking frequency divider, and the frequency of the second oscillator signal is half of the frequency of the first oscillator signal.

15. The method for generating oscillator signals as claimed in claim 14, wherein the first inductor module comprises one of an inductor and a pair of inductors coupled in parallel, the second inductor module comprises one of an inductor and a pair of inductors coupled in parallel, and the third inductor module comprises an inductor and a pair of inductors coupled in parallel.

16. The method for generating oscillator signals as claimed in claim 14, wherein the first VCO unit comprises a first varactor unit coupled between the first terminal and the second terminal of the first VCO unit.

17. The method for generating oscillator signals as claimed in claim 16, wherein the first inductor module and the first varactor unit form a first oscillator unit, and the first varactor unit changes the capacitance of the first varactor unit in response to the at least one adjustable voltage, so as to adjust the frequency of the first oscillator signal.

18. The method for generating oscillator signals as claimed in claim 14, wherein the second VCO unit comprises a second varactor unit coupled between a first output terminal and a second output terminal of the second VCO unit.

19. The method for generating oscillator signals as claimed in claim 18, wherein the second inductor module and the second varactor unit form a second oscillator unit, and the second varactor unit changes the capacitance of the second varactor unit in response to the at least one adjustable voltage, so as to adjust the frequency of the second oscillator signal.

20. The method for generating oscillator signals as claimed in claim 14, wherein the second VCO unit comprises a third varactor unit coupled between a third output terminal and a fourth output terminal of the second VCO unit.

21. The method for generating oscillator signals as claimed in claim 20, wherein the third inductor module and the third varactor unit form a third oscillator unit, the third varactor unit changes the capacitance of the third varactor unit in response to the at least one adjustable voltage, so as to adjust the frequency of the second oscillator signal.

22. The method for generating oscillator signals as claimed in claim 14, wherein the first oscillator signal comprises a pair of differential output signals inverted to each other.

23. The method for generating oscillator signals as claimed in claim 14, wherein the second oscillator signal comprises a set of quadrature output signals.

* * * * *